United States Patent [19]
Neilson et al.

[11] Patent Number: 5,399,892
[45] Date of Patent: Mar. 21, 1995

[54] MESH GEOMETRY FOR MOS-GATED SEMICONDUCTOR DEVICES

[75] Inventors: John M. S. Neilson, Norristown; Carl F. Wheatley, Jr., Drums; Frederick P. Jones, Mountaintop, all of Pa.; Victor A. K. Temple, Clifton, N.Y.

[73] Assignee: Harris Corporation, Melbourne, Fla.

[21] Appl. No.: 158,444

[22] Filed: Nov. 29, 1993

[51] Int. Cl.⁶ .......................................... H01L 29/10
[52] U.S. Cl. .................................. 257/341; 257/139; 257/328
[58] Field of Search ............... 257/341, 342, 328, 139

[56] References Cited
U.S. PATENT DOCUMENTS 4,561,003 12/1985 Tihanyi et al. ..................... 257/341
4,833,513 5/1989 Sasaki .................................. 257/342

*Primary Examiner*—Robert P. Limanek
*Attorney, Agent, or Firm*—Rogers & Killeen

[57] ABSTRACT

A pattern for a wafer for a MOS-gated semiconductor device includes plural ribbons extending from a source contact region to another source contact region, each of the ribbons having a single source region between two channel regions, so as to increase the device's current-carrying capability per unit area relative to the prior art. The pattern increases the size of the active current-carrying area (the channel and neck regions of the device) relative to the area of the source contact areas. The source contact regions may be discrete or linear, and the ribbons may extend therefrom perpendicularly or at other angles.

24 Claims, 4 Drawing Sheets

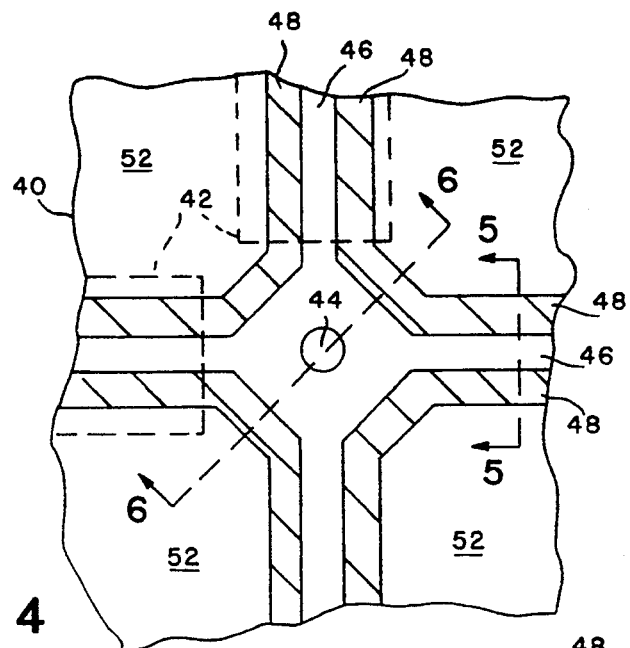
FIG. 4
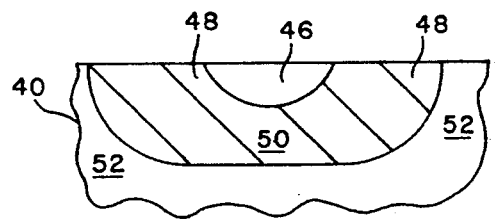
FIG. 5
FIG. 6
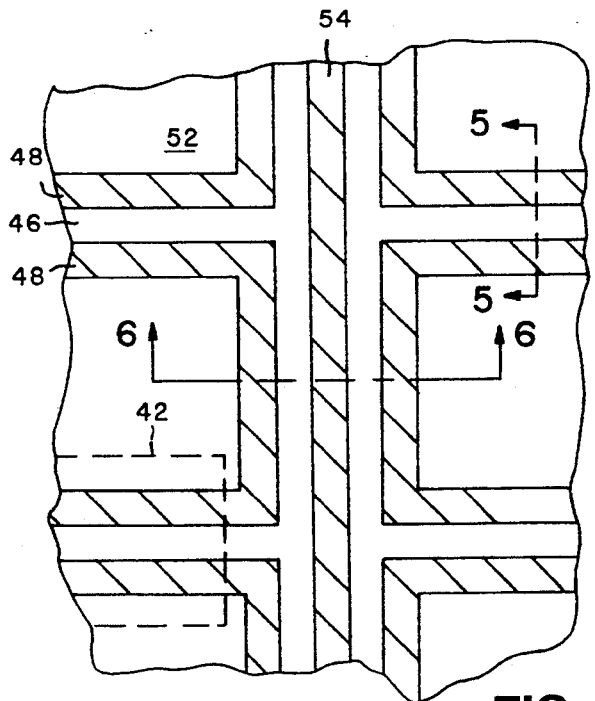
FIG. 7

MESH GEOMETRY FOR MOS-GATED SEMICONDUCTOR DEVICES

BACKGROUND OF THE INVENTION

The present invention is directed to a structure for a MOS-gated semiconductor device that increases the size of the active current-carrying area of the device relative to the device's contact areas, and more particularly to a mesh structure for a wafer used in a MOS-gated semiconductor device that relatively increases the size of the channel and neck regions and decreases the size of the source contact regions.

Known power MOSFET's may comprise a multiplicity of individual cells that may be electrically connected in parallel. The cells are typically small; for example, each cell may be about twenty-five microns in width so that tens of thousands may be formed on a single silicon wafer on the order of 300 mils square. A number of geometric arrangements for the unit cells are possible, including elongated strips.

In power MOSFET's, it is known to form such devices by a double diffusion technique which begins with a common drain region of, for example, N conductivity type material, that is formed on a N+ conductivity type substrate. Within the drain region, a base region is formed by means of a first diffusion to introduce impurities of one type, and then a source region is formed entirely within the base region by means of a second diffusion to introduce impurities of the opposite type. If the drain region is N type, then the first diffusion is done with acceptor impurities to produce a P type base region, and the second diffusion is done with donor impurities to produce a N+ type source region. At the drain region surface, the base region exists as a band between the source and drain regions.

Conductive gate electrodes are formed on the surface over the base region band and separated by a gate insulating layer to define an insulated gate electrode structure. When voltage of a proper polarity is applied to the gate electrodes during operation, an electric field extends through the gate insulating layer into the base region inducing a conductive channel just under surface. Current flows horizontally between the source and drain region through the conductive channel.

With reference now to FIG. 1, known MOS-gated semiconductor devices may include a multi-layer wafer 12 overlain with a gate 14 and source metal 16. For example, in a metal oxide semiconductor field effect transistor (MOSFET) the layers may include an N+ substrate 18, an N− voltage supporting layer 20, a body region 22 implanted in the voltage supporting layer 20, and an N+ source region 24 implanted in the body region 22. As may be seen in FIG. 1, the body regions 22 and source regions 24 may form cells separated by portions of the voltage supporting layer 20. The region between the cells near the surface of the wafer is known as the neck region 26 and the region between the source region and the neck region near the surface of the wafer is known as the channel region 28. The channel region 28 and the neck region 26 are the active current-carrying areas of the device.

Various patterns for the MOS-gated device's cellular structure are known in the art. A hex geometry pattern is illustrated in FIG. 1, a stripe geometry pattern is illustrated in FIG. 2 and an atomic lattice pattern is illustrated in FIG. 3. It may be seen that a wafer 12 for a MOS-gated semiconductor device often includes a vertical cross section showing the cellular structure (for example, as seen on the left-hand face of the vertical cross sections of FIGS. 1–3). Note that other cross sections (for example, the right-hand face of the vertical cross sections of FIGS. 2–3) may not include the cellular structure.

To increase the current-carrying capability of a MOS-gated semiconductor device, it is desirable to increase the current-carrying area per unit area of device. With reference to FIGS. 1-3, one of the regions that takes up current-carrying area is the region in the center of each cell or stripe that is contacted by the source metal 16. This region is known as the source contact region 30.

One method by which the current carrying area can be increased is to reduce the area at the top surface of the chip utilized by the source contact area. This reduction must be made, if at all, while (a) providing sufficient source contacts; (b) maintaining an upper surface structure which permits ready access to the source contact area and to the distribution of gate voltage over the channel regions; and (c) maintaining or improving the amount of channel area; all while maintaining a topography which is readily manufacturable.

Accordingly, it is an object of the present invention to reduce the size of the source contact region relative to the size of the active current-carrying area of the device, while maintaining the cellular structure of MOS-gated devices.

It is a further object of the present invention to provide a novel pattern for a wafer used in a MOS-gated semiconductor device in which the pattern includes an array of ribbons extending linearly from a source contact region, each of the ribbons having a single source region between two channel regions.

These and many other objects and advantages of the present invention will be readily apparent to one skilled in the art to which the invention pertains from a perusal of the claims, the appended drawings, and the following detailed description of preferred embodiments.

DESCRIPTION OF THE DRAWINGS

FIG. 4 is a partial plan view of a surface of a wafer for a MOS-gated semiconductor device illustrating the linearly extending ribbons of the present invention.

FIG. 5 is a vertical cross section through line 5—5 of FIG. 4.

FIG. 6 is a vertical cross section through line 6—6 of FIG. 4.

FIG. 7 is a partial plan view of the surface of a wafer for a MOS-gated semiconductor device illustrating an alternative embodiment of the linearly extending ribbons of the present invention.

DESCRIPTION OF PREFERRED EMBODIMENTS

Figure 1:
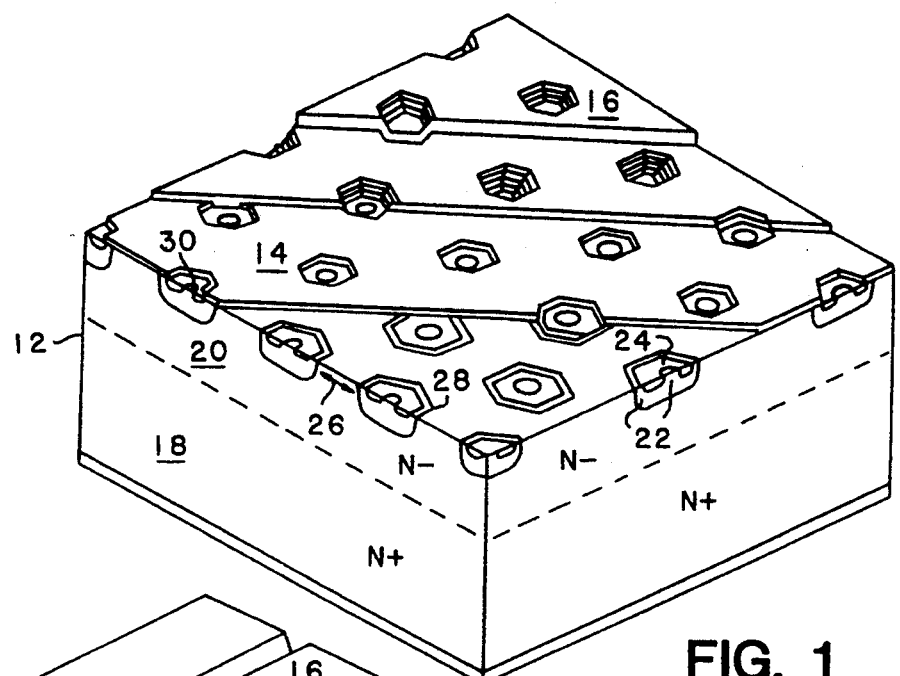
FIG. 1 is a partial pictorial view of a hex geometry MOS-gated semiconductor device of the prior art in vertical cross section.
Figure 2:
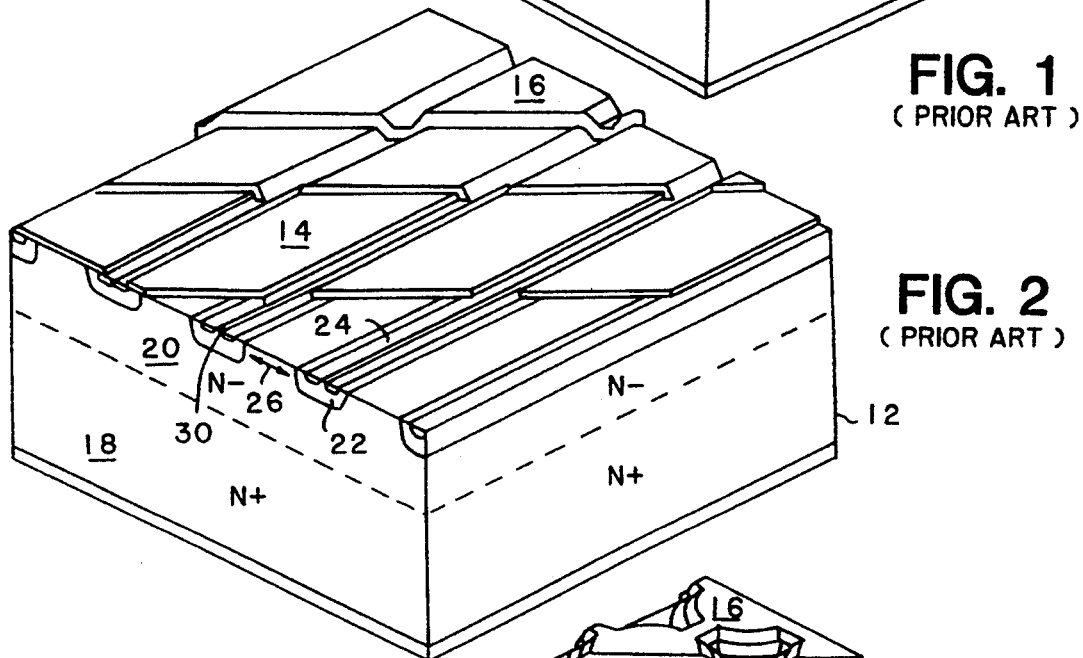
FIG. 2 is a partial pictorial view of a stripe geometry MOS-gated semiconductor device of the prior art in vertical cross section.
Figure 3:
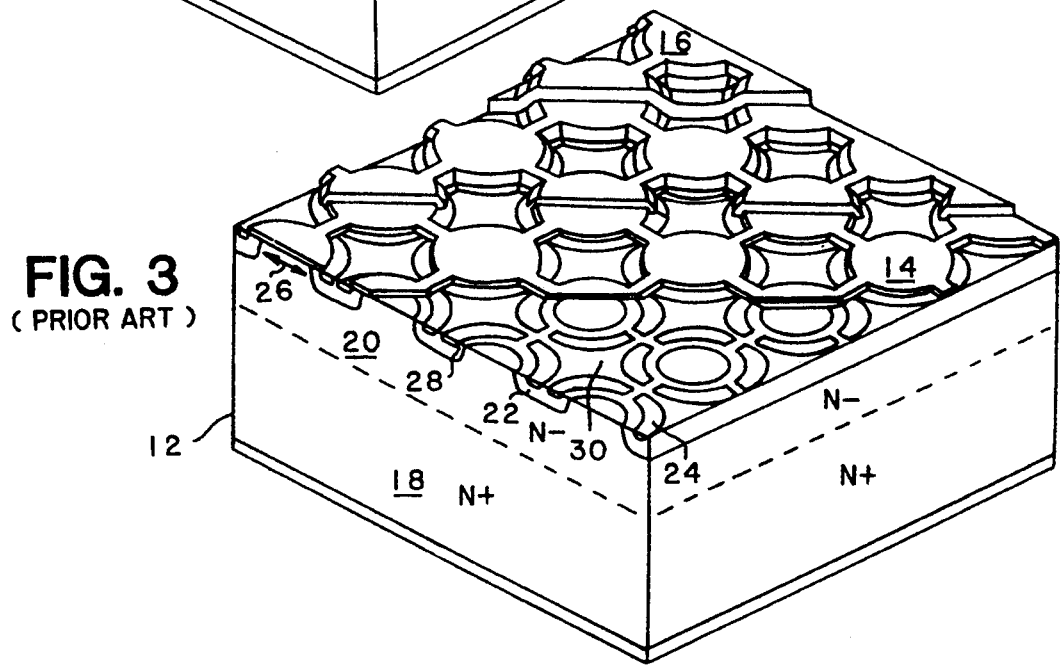
FIG. 3 is a partial pictorial view of an atomic lattice geometry MOS-gated semiconductor device of the prior art in vertical cross section.

With reference now to FIG. 4, an embodiment of the present invention may include a pattern for a wafer 40 for a MOS-gated semiconductor device in which plural ribbons 42 extend from a source contact region 44 to other source contact regions 44. Each of the ribbons 42 may include a single source region 46 between two channel regions 48. As may be seen in FIGS. 5 and 6 (vertical cross sections through lines 5—5 and 6—6 of FIG. 4), the two channel regions 48 extend into the wafer 40 and connect beneath the source region 46 forming a body region 50, while maintaining the cellular structure of the device. Neck regions 52 are between the ribbons 42.

The pattern of the present invention increases the size of the active current-carrying area (the current-carrying area including the channel regions 48 and the neck regions 52) relative to the size of the source contact regions 44, thereby providing greater current-carrying capability per unit area compared to the prior art.

With reference now to FIG. 7, in a further embodiment of the present invention the discrete source contact regions 44 illustrated in FIG. 4 may be extended to form a linear source contact region 54. As in the embodiment of FIG. 4, the ribbons 42 extend from the linear region 54 to other linear regions 54.

Figure 8:
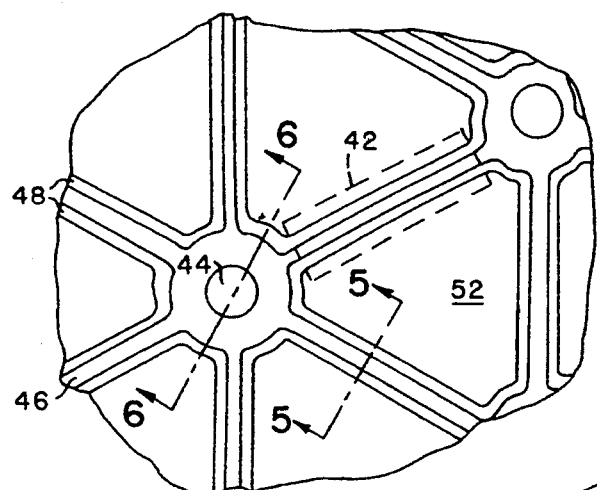
FIG. 8 is a partial plan view of the surface of a wafer for a MOS-gated semiconductor device illustrating another alternative embodiment of the linearly extending ribbons of the present invention.
Figure 9:
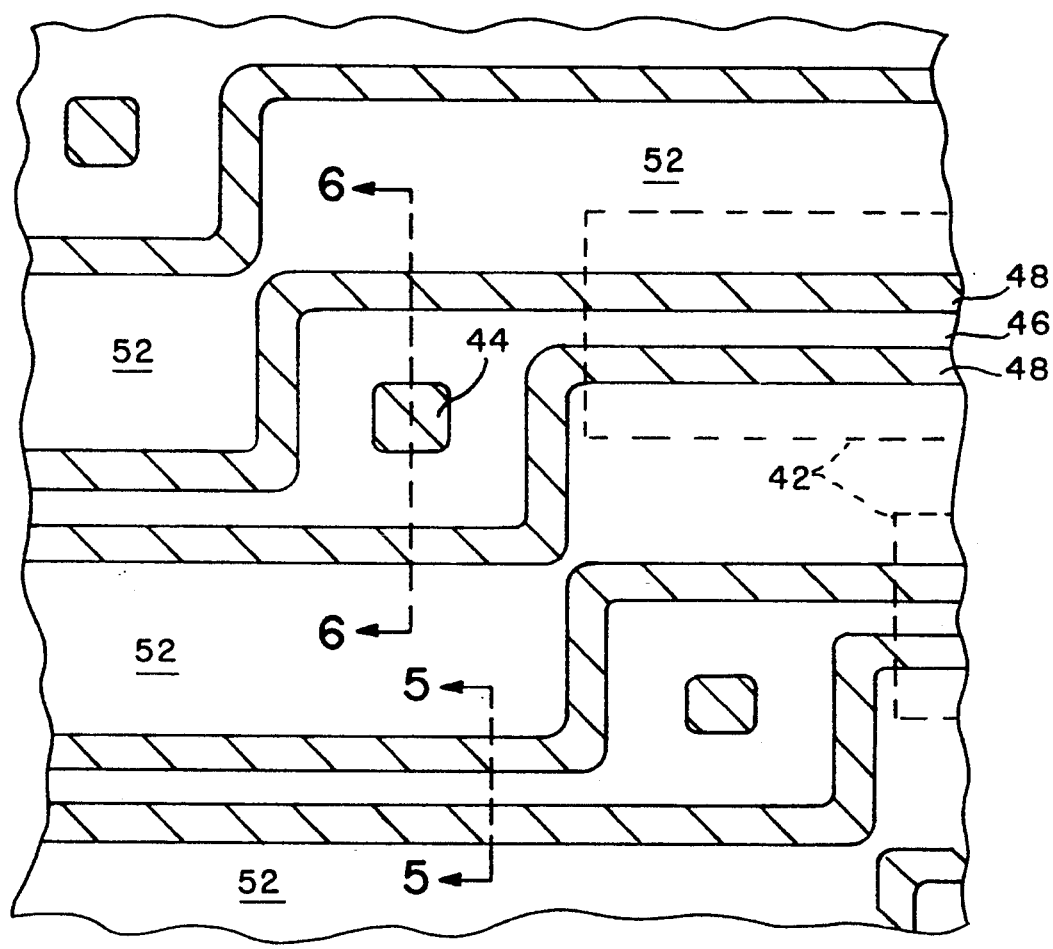
FIG. 9 is a partial plan view of the surface of a wafer for a MOS-gated semiconductor device illustrating yet another alternative embodiment of the linearly extending ribbons of the present invention.

The ribbons 42 of the present invention may extend from discrete source contact regions 44 (or linear source contact regions 54) at angles or in arrangements other than those illustrated in FIGS. 4 and 7. For example, as seen in FIG. 8 the ribbons 42 may be formed at 60° angles to each other, or as seen in FIG. 9, the ribbons 42 may be offset as they extend in parallel from the source contact regions 44.

Figure 10:
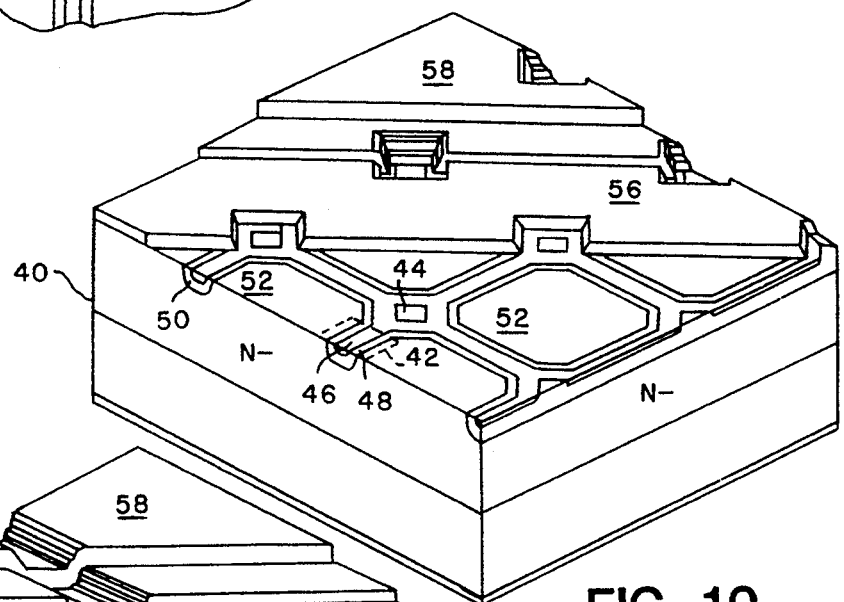
FIG. 10 is a partial pictorial view of a MOS-gated semiconductor device of the present invention illustrating an embodiment of the pattern of FIG. 4 in vertical cross section.
Figure 11:
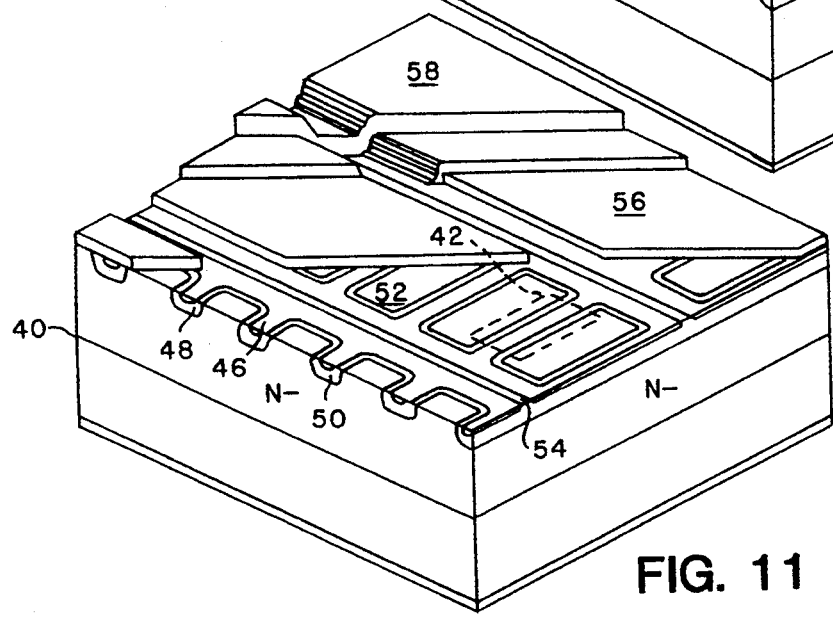
FIG. 11 is a partial pictorial view of a MOS-gated semiconductor device of the present invention illustrating an embodiment of the pattern of FIG. 7 in vertical cross section.

The patterns of the present invention may be more clearly seen with reference to FIGS. 10 and 11 in which the same element numbers as in FIGS. 4 and 7 have been used to facilitate an understanding thereof. The gate 56 and source metal 58 are added as in the prior art.

The method of manufacturing a MOS-gated semiconductor device of the present invention may include the following steps:

a. Grow an N-type epitaxial layer on an appropriate substrate, N+ for MOSFET or P+ for an insulated gate bipolar transistor (IGBT).

b. Oxidize the wafer, photomask and etch the oxide to produce a mesh oxide pattern that will define the body regions 50.

c. Photomask with the body region pattern to exclude the body region implant from the edge of the device.

d. Implant and diffuse the body regions 50.

e. Photomask with the source contact region 44, 54 pattern and implant and diffuse the source contact regions 44, 54.

f. Photomask with the source regions 46, allowing the source regions to be defined by the same mesh oxide that define the body regions 50.

g. Implant and diffuse the source regions 46.

h. Strip the mesh oxide and grow gate oxide.

i. Deposit and dope the polysilicon gate 56, photomask and etch the polysilicon gate.

j. Deposit the interlayer dielectric and define the contact openings, deposit and define the source metal 58, deposit and define overcoat.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

We claim:

1. A wafer for a MOS-gated semiconductor device comprising:
   plural ribbons extending linearly from a source contact region of a first semiconductor type in a surface of the wafer;
   each of said ribbons having a single source region of a second semiconductor type between two channel regions of the first semiconductor type, said two channel regions being connected by a body region of the first semiconductor type interior to the wafer; and
   a neck region of the second semiconductor type between each of said ribbons.

2. The wafer of claim 1 wherein said source contact region extends linearly and said ribbons are generally perpendicular thereto.

3. The wafer of claim 1 wherein said plural ribbons comprise a mesh with said ribbons intersecting at nodes thereof, and wherein one said source contact region is located in each of said nodes.

4. The wafer of claim 1 wherein said ribbons extend radially from said source contact region.

5. The wafer of claim 1 wherein said ribbons extend at about 90° to each other.

6. The wafer of claim 1 wherein said ribbons extend at about 60° to each other.

7. A MOS-gated semiconductor device comprising:
   a surface with plural spaced-apart neck regions, each of said neck regions surrounded by a channel region that is surrounded by a source region, each said source region being common with the source regions for adjacent ones of said plural neck regions; and
   plural spaced-apart source contact regions placed in predetermined portions of said source regions.

8. The device of claim 7 wherein said plural spaced-apart source contact regions are generally parallel stripes that divide said plural neck regions into rows.

9. The device of claim 7 wherein each of said plural spaced-apart source contact regions is placed at an intersection of a plurality of said source regions.

10. The device of claim 7 wherein two of said source regions extend generally parallel from one of said source contact regions.

11. The device of claim 7 wherein each of said plural neck regions has at least four linear sides.

12. The device of claim 11 wherein each of said plural neck regions is a parallelogram and said plural spaced-apart source contact regions are stripes that are generally parallel to two sides of said plural neck regions.

13. The device of claim 11 wherein each of said plural spaced-apart source contact regions is a parallelogram with each side being generally parallel to one side of each of four adjacent said neck regions.

14. A method of increasing the current-carrying capability of a MOS-gated semiconductor device comprising the steps of:
   extending ribbons from a source contact region of a first semiconductor type in a surface layer of the device, each of said ribbons comprising a single source region of a second semiconductor type between two channel regions of the first semiconductor type connected beneath said source region by a body region of the first semiconductor type; and
   forming a neck region of a semiconductor of the second type between each of said ribbons,
   said ribbons being extended and said neck region being formed so as to increase the areal size thereof relative to the areal size of the source contact region to thereby increase the current-carrying capability of the device.

15. The method of claim 14 wherein said ribbons are extended to form a mesh array of said ribbons wherein one said source contact region is at each node of said array.

16. The method of claim 14 wherein said source contact region extends linearly and said ribbons are extended generally perpendicular therefrom.

17. A wafer for a MOS-gated semiconductor device comprising:
   plural ribbons extending generally perpendicular from a linearly extending source contact region of a first semiconductor type in a surface of a wafer;
   each of said ribbons having a single source region of a second semiconductor type between two channel regions of the first semiconductor type that are connected interior to the wafer beneath said source region; and
   a neck region of the second semiconductor type between each of said ribbons.

18. The wafer of claim 17 wherein adjacent said ribbons are generally parallel.

19. A wafer for a MOS-gated semiconductor device comprising:
   a mesh in a surface of a wafer, said mesh comprising plural ribbons intersecting at nodes of said mesh, and a source contact region of a first semiconductor type in a surface of a wafer at each of said nodes;
   each of said ribbons having a single source region of a second semiconductor type between two channel regions of the first semiconductor type that are connected interior to the wafer beneath said source region; and
   a neck region of the second semiconductor type between each of said ribbons.

20. The wafer of claim 19 wherein adjacent said ribbons extend at angles about 90° to each other.

21. The wafer of claim 19 wherein adjacent ribbons extend at angles about 60° to each other.

22. The wafer of claim 19 wherein said ribbons extend radially from said source contact region.

23. A method of increasing the current-carrying capability of a MOS-gated semiconductor device comprising the steps of:
   extending plural ribbons generally perpendicularly from a linerarly extended source contact region of a first semiconductor type in a surface layer of the device, each of the ribbons comprising a single source region of a second semiconductor type between two channel regions of the first semiconductor type that are connected beneath the source region; and
   forming a neck region of a semiconductor of the second type between each of the ribbons.

24. A method of increasing the current-carrying capability of a MOS-gated semiconductor device comprising the steps of:
   providing plural ribbons that extend from nodes of a mesh, each of the nodes having a source contact region of a first semiconductor type in a surface layer of the device, each of the ribbons comprising a single source region of a second semiconductor type between two channel regions of the first semiconductor type that are connected beneath the source region; and
   forming a neck region of a semiconductor of the second type between each of the ribbons.

* * * * *